United States Patent [19]
Akamatsu et al.

[11] Patent Number: 5,631,867
[45] Date of Patent: May 20, 1997

[54] SEMICONDUCTOR STORAGE DEVICE REQUIRING SHORT TIME FOR PROGRAM VOLTAGE TO RISE

[75] Inventors: Hiroshi Akamatsu; Yukinobu Adachi; Susumu Tanida; Tooru Ichimura, all of Hyogo, Japan

[73] Assignees: Mitsubishi Denki Kabushiki Kaisha; Mitsubishi Electric Engineering Co., Ltd., both of Tokyo, Japan

[21] Appl. No.: 456,328

[22] Filed: Jun. 1, 1995

[30] Foreign Application Priority Data

Jun. 23, 1994 [JP] Japan .................. 6-141712

[51] Int. Cl.$^6$ .................................................. G11C 7/00
[52] U.S. Cl. .................. 365/189.09; 365/226; 327/143; 327/538
[58] Field of Search .............. 365/189.09, 226, 365/227; 327/530, 534, 536, 537, 538, 142, 143

[56] References Cited

U.S. PATENT DOCUMENTS

| | | | |
|---|---|---|---|
| 5,010,259 | 4/1991 | Inoue | 365/189.09 |
| 5,038,325 | 8/1991 | Douglas et al. | 365/189.06 |
| 5,184,035 | 2/1993 | Sugibayashi | 365/189.09 |
| 5,367,489 | 11/1994 | Park | 365/189.11 |
| 5,446,697 | 8/1995 | Yoo | 365/226 |

FOREIGN PATENT DOCUMENTS

0581443A2  6/1993  European Pat. Off. .

*Primary Examiner*—David C. Nelms
*Assistant Examiner*—Son Mai
*Attorney, Agent, or Firm*—Lowe, Price, LeBlanc & Becker

[57] ABSTRACT

An external power source voltage Vcc rises until it exceeds the threshold voltage Vth of an NMOS transistor diode-connected between the external power source (voltage Vcc) and an internal boosted power source (voltage Vpp), whereupon the NMOS transistor is turned on, supplying the internal boosted power source with a voltage (Vcc−Vth) until the power source voltage Vcc reaches its final value. And when the internal reset signal ZPOR expires, the internal boosted power source generating circuit is started to operate so that the internal boost source voltage Vpp is boosted to an intended level Vpp. As a result, when the power is turned on, early stabilization of the boosted power source voltage is realized in a semiconductor storage device.

16 Claims, 7 Drawing Sheets

SEMICONDUCTOR STORAGE DEVICE REQUIRING SHORT TIME FOR PROGRAM VOLTAGE TO RISE

BACKGROUND OF THE INVENTION

1. Field of the Invention

The present invention relates to a semiconductor storage device and particularly it relates to a semiconductor storage device adapted to execute a program using a program voltage.

2. Description of Related Arts

A conventional semiconductor storage device comprises a memory cell array and a peripheral circuit. Said peripheral circuit comprises an internal boosted power source generating circuit which, when receiving an external power source voltage Vcc, delivers an internal boosted power source voltage Vpp for transferring "H" data to memory cells, and an internal reset circuit which delivers an internal reset signal ZPOR for starting said internal boosted power source generating circuit.

A conventional semiconductor storage device will now be described with reference to the drawings.

FIG. 8 is a block diagram showing an example of the arrangement of said internal boosted power source generating circuit.

In FIG. 8, the internal boosted power source generating circuit comprises an internal boosted power source voltage Vpp generating circuit 201, an internal boosted power source voltage Vpp supplementing circuit 203, and a clamp 205. The Vpp generating circuit 201 comprises a ring oscillator 207 and a pump 209. The Vpp supplementing circuit 203 comprises a level detector 211, a ring oscillator 213 and a pump 215.

The Vpp generating circuit 201 is connected to an external power source and generates the internal boosted power source voltage Vpp on the basis of the external power source voltage Vcc. The ring oscillator 207 in the Vpp generating section 201 produces and delivers a pulse signal having an amplitude |GND−Vcc| from the external power source voltage Vcc. The pump 209 is connected to the ring oscillator 207 and is actuated by a pulse signal from the ring oscillator 207 to generate the internal boosted power source voltage Vpp. The Vpp supplementing circuit 203 is connected to the Vpp generating circuit 201 and generates a voltage which supplements the internal boosted power source voltage Vpp when the latter is at lower level. The level detector 211 in the Vpp supplementing circuit 203 is designed such that when the level of the internal boost source voltage Vpp is lower than a target value, it detects said level and delivers a signal (operating signal) to actuate the ring oscillator 213. The ring oscillator 213 is connected to the level detector 211, and upon receiving an operating signal from the level detector 211, it produces and delivers a pulse signal. The pump 215 is connected to the ring oscillator 213 and is adapted to be actuated by a pulse signal from the ring oscillator 213 to deliver a voltage for supplementing the internal boosted power source voltage Vpp. The clamp 205 is connected to the Vpp generating circuit 201 and to the Vpp supplementing circuit 203 such that if the level of the internal boosted power source voltage Vpp delivered from either the Vpp generating circuit 201 or the Vpp supplementing circuit 203 is higher than a target value, it detects said voltage and delivers the internal boosted power source voltage Vpp after it has controlled the latter to a suitable value.

FIG. 9 is a view showing the internal arrangement of the pumps 209 and 215 shown in FIG. 8.

In FIG. 9, each pump comprises NMOS transistors 301, 311, 313 and 319, a clamp 303, inverters 305 and 307, and capacitors 309, 315 and 317.

Terminal p, q, r and s are connected to an external power source to have an external power source voltage Vcc applied thereto. The NMOS transistor 301 of diode junction sets an initial value for the boosted power source voltage Vpp. The clamp 303 has a plurality (3, in FIG. 9) of NMOS transistors of diode junction and is designed such that when the level of the internal boosted power source voltage Vpp rises too high, it detects said level to control the latter to a suitable value.

The inverter 305 is connected at its terminal u to the ring oscillator 207 or 213 of FIG. 8 and adapted to deliver a pulse signal having an amplitude |GND−Vcc|. The inverter 307 is connected to the inverter 305 and adapted to deliver an inverted pulse signal having an amplitude |GND−Vcc|.

The capacitor 309 is connected to the NMOS transistor 301 and to the inverter 305 and is designed such that when a voltage is periodically applied to one electrode thereof associated with the inverter 305, a voltage is applied to the other electrode from the NMOS transistor 301, whereby the capacitor is charged. The NMOS transistors 311 and 313 have their drains connected to the external power source and their gates connected to the capacitor 309; thus, when the capacitor 309 is charged until the electrode voltage exceeds the threshold voltage of the NMOS transistors 311 and 313, whereupon they are turned on, feeding the voltage from the power source.

The capacitor 315 is connected to the inverter 307 and the drain of the NMOS transistor 311, while the capacitor 317 is connected to the inverter 307 and the NMOS transistor 313. When a voltage is applied, with a period inverted with respect to the capacitor 309, to the electrode associated with the inverter 307, a voltage is applied to the other electrode from the associated NMOS transistor 315 or 317, whereby the capacitor is charged.

The NMOS transistor 319 has its source connected to the drain of the NMOS transistor 311 and to the capacitor 315 and its gate connected to the drain of the NMOS transistor 313 and to the capacitor 317. When this NMOS transistor 319 is turned on, the voltages obtained by charging the capacitors 315 and 317 and the voltages obtained by turning on the NMOS transistors 311 and 313 are added. As a result, a voltage can be obtained which is higher than the power source voltage Vcc necessary for generating the target value Vpp of the internal boosted power source voltage. And the internal boosted power source voltage Vpp thus obtained is delivered from the terminal w connected to the drain of the NMOS transistor 319 and thus delivered from the Vpp generating circuit 201 of FIG. 8.

FIG. 10 is a timing chart showing how the internal boosted power source voltage Vpp is boosted when the power is turned on in a conventional semiconductor storage device.

In the conventional semiconductor storage device, when the external power source is off (time t; to$<$t$<$t$_1$), the external power source voltage Vcc, the internal boosted power source voltage Vpp and the internal reset signal ZPOR are all at the ground voltage GND. When the power is turned on (t$_1$$<$t$<$t$_7$), the internal reset signal maintains the ground voltage GND level for a given time, resetting the circuits in the device. When the internal reset signal ZPOR turns to "H" level, the reset time is up and the internal boosted power source generating circuit is started (t$_7$) elevate the internal boosted power source voltage Vpp from the ground voltage GND to an intended boosted level (t$_7$$<$t$<$t$_{11}$).

In the prior art, however, since the internal boosted power source voltage Vpp rises only after the external power source voltage Vcc has risen when the external power source is turned on, it takes time for the internal boosted power source voltage to reach the intended boosted level. In the semiconductor storage device comprising the internal boosted power source generating circuit and the internal reset circuit as described above, if a substantial time has to elapse before an intended boosted level can be reached after the rise of the internal boosted power source voltage Vpp, then the following problems arise.

(1) The specification telling that the internal boosted power source voltage Vpp will rise in a given time cannot be ensured;

(2) There are adverse effects including latch-up sometimes taking place in a semiconductor;

Latch-up mentioned in (2) will now be described with reference to the drawings.

FIG. 11 shows an example of the peripheral circuit of a semiconductor storage device, said circuit being liable to cause latch-up when the rise of the internal boosted power source voltage is slow. This circuit is used to elevate the potential at the node c from the ground voltage GND to the same voltage as the internal boosted power source voltage Vpp.

In FIG. 11, this circuit comprises PMOS transistors 401, 402 and 403 and NMOS transistors 404, 405 and 406. The terminals k and z connected to the respective sources of the PMOS transistors 401 and 402 and the terminal n connected to the gate of the PMOS transistor 403 are connected to the internal boosted power source, and the terminal m connected to the source of the PMOS transistor 403 is connected to the external power source. The internal boosted power source voltage Vpp is supplied from the node A and the external power source voltage Vcc is supplied from the node B.

One cycle of operation will now be described with reference to a timing chart shown in FIG. 12. However, suppose that the timing chart is an ideal one in which the external power source voltage Vcc and the internal boosted power source voltage Vpp have already risen to a final value and an intended boosted level, respectively.

The nodes A and B are supplied with the ground voltage END and the external power source voltage Vcc (A; $t_{100}$<F t<F $t_{103}$, B; $t_{100}$<F t<F $t_{101}$). When the supply of the external power source voltage Vcc from the node B is stopped ($t_{101}$), the PMOS transistor 403 is turned on to supply the node C with a voltage (Vcc−Vpp). When the internal boosted power source voltage Vpp is supplied from the node A ($t_{103}$), the NMOS transistor 404 and the PMOS transistor 402 are turned on to supply the node C with the internal boosted power source voltage Vpp ($t_{104}$), and the voltage at the node C becomes equal to the internal boosted power source voltage Vpp ($t_{105}$).

Again, the node B is supplied with the external power source voltage Vcc ($t_{106}$), and when the node A starts to be supplied with the ground voltage GND ($t_{107}$), the voltage at the node C lowers to the ground voltage GND ($t_{108}$).

FIG. 13 is a view showing the construction of the PMOS transistor 403 in FIG. 11. Latch-up will now be described using this FIG. 13.

In FIG. 13, the PMOS transistor 403 comprises an n-well 503 formed in a p-type substrate 501, a source 505 in p+ layer form formed in said n-well 503, a drain 507 in p+ layer form, and a gate electrode 509. The terminals m and n correspond to the terminals m and n in FIG. 11.

The gate 509 is connected to the node B. The internal boosted power source voltage Vpp is applied to the n-well 503. The external power source voltage Vcc is fed in from the source 505 and delivered from the drain 507 to the node C.

Here, it is to be noted that while the external power source voltage Vcc rises at a stroke, if the internal boosted power source voltage Vpp takes time to rise, then a forward bias (p→n) is applied longitudinally from the source 505 to the n-well 503, causing latch-up to take place, damaging the device.

SUMMARY OF THE INVENTION

Accordingly, an object of this invention is to realize early stabilization of a program voltage when the power is turned on in a semiconductor storage device.

Another object of this invention is to effect boost of a program voltage in a short time when the power is turned on in a semiconductor storage device.

Yet another object of this invention is to save power consumption when the power is turned on in a semiconductor device.

A further object of this invention is to prevent occurrence of latch-up when the power is turned on in a semiconductor device.

Still a further object of this invention is to effect boost of a program voltage in a short time in a program voltage generating method for a semiconductor storage device.

These objects are achieved in that a semiconductor storage device comprises the following elements. That is, a semiconductor storage device for executing a program using a program voltage according to this invention comprises a terminal for receiving a power source voltage, a detector for detecting the varying level of rise of said power source voltage, and a booster for boosting said program voltage on the basis of the result of the rise of level.

According to the invention, a power source voltage is received, the changing level of rise is detected, and a program voltage is boosted on the basis of the result of the level of rise; therefore, immediately after the rise of the power source voltage and before the start of the boosted power source, the program voltage rises and is boosted. Since the program voltage is boosted immediately after the power source voltage has risen when the power is turned on, the time taken to reach an intended boosted level is shortened.

As a result, in a semiconductor storage device, early stabilization of a program voltage is realized.

Preferably, such program voltage comprises a first program voltage for executing the program and a second program voltage lower than said first program voltage. The semiconductor storage device is provided with a program voltage generator for generating the first program voltage, said generator boosting the second program voltage to the first program voltage.

In another aspect of this invention, the semiconductor storage device executes a program using the first program voltage. The semiconductor storage device comprises a power source voltage terminal for receiving a power source voltage to generate a first program voltage after the lapse of a predetermined time, a program voltage generator, and a rectifier connected to the power source voltage terminal and to the program voltage generator to pass a current only from the power source voltage terminal to the program voltage generator. The rectifier is adapted, after the lapse of said predetermined time, to boost the potential at the program voltage generator to a second program voltage which is lower than the first program voltage.

A rectifier is provided which passes a current only from the power source voltage terminal to the program voltage generator and which elevates the potential at the program voltage generator to the second program voltage lower than the first program voltage before the program voltage generator generates the predetermined first program voltage. Because of the current passing only from the power source voltage terminal to the program voltage generator, before the program voltage generator generates a first potential upon turning-on of the power, its output is boosted to a second potential which is lower than the first potential. As a result, the power consumption can be saved as compared with the case of boosting the output from the predetermined reference voltage to the first program voltage at a stroke.

In a further aspect of this invention, a program voltage generating method for a semiconductor storage device for executing a program using a predetermined first voltage comprises the steps of detecting a power source voltage, boosting the program voltage to a second voltage which is lower than a first voltage, and boosting the program voltage to the first voltage subsequent to the boosting to the second voltage.

Depending upon the detected power source voltage, the program voltage is boosted to the second voltage lower than the first predetermined voltage and then to the first predetermined voltage; therefore, in the program voltage generating method for a semiconductor storage device, the boosting of the program voltage can be effected in a short time.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Semiconductor storage device according to an embodiment of the present invention will now be described.

Figure 1:
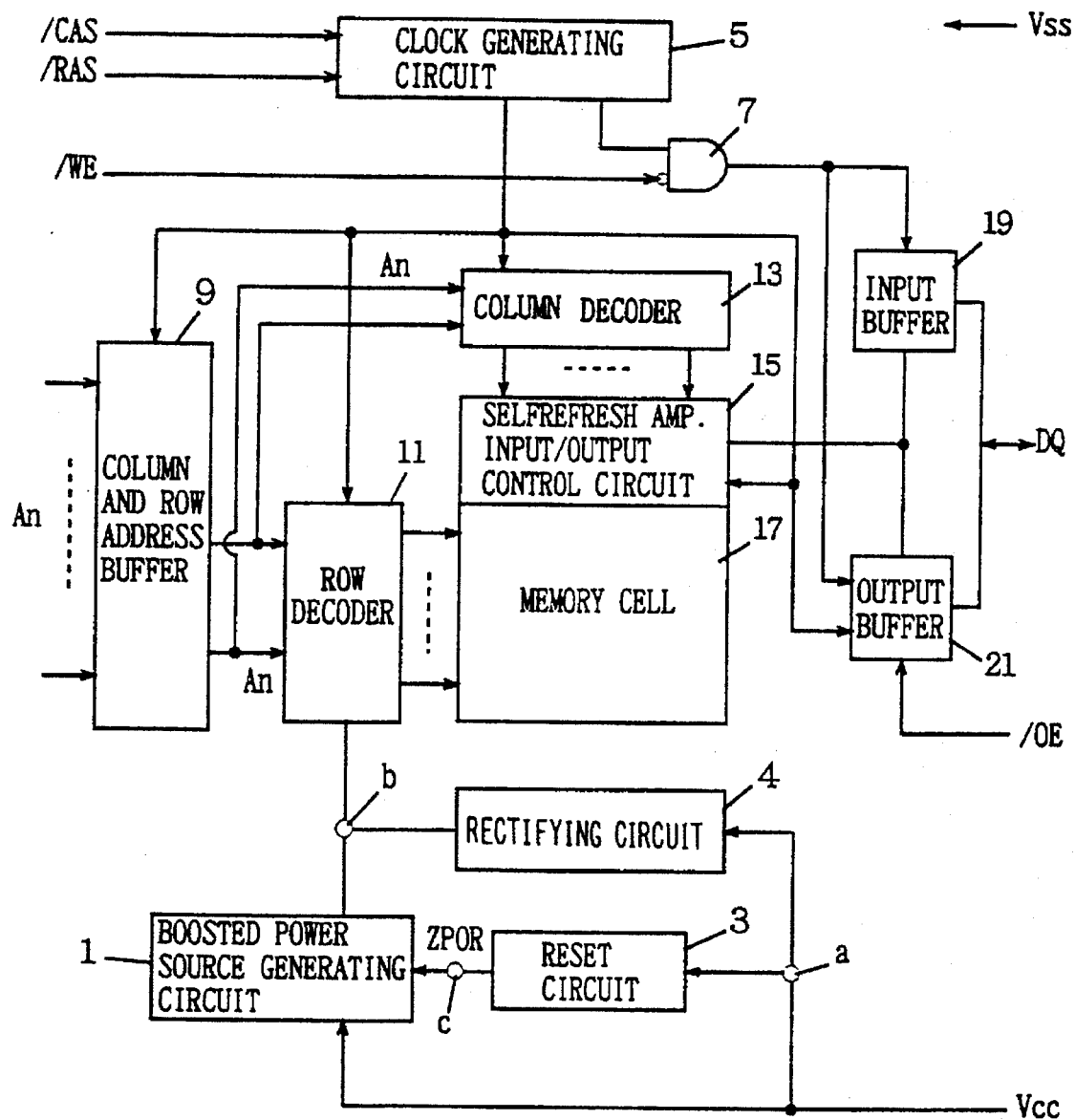
FIG. 1 is a block diagram showing the entire arrangement of a DRAM which is an example of a semiconductor storage device according to an embodiment of the present invention.

Referring to FIG. 1, a semiconductor storage device comprises an internal boosted power source generating circuit 1, an internal reset circuit 3, a rectifying circuit 4, a clock generating circuit 5, a gate 7, a row/column address buffer 9, a row decoder 11, a column decoder 13, a sense refresh amplifier and input/output control circuit 15, a memory cell array 17, an input buffer 19, and an output buffer 21. In response to a column address strobe input /CAS ("/" denotes a reverse signal), a row address strobe input /RAS and a read/write designation input /WE, the semiconductor storage device performs predetermined operations to store data in predetermined memory cells in the memory cell array 17 corresponding to the address and row designated by the address input An (for example, n=0, 1, 2, ... 11) or read stored data. Data to be stored is transferred to the memory cell array 17 through the input buffer 19 and the read data is delivered through the output buffer 21. These operations are the same as in an ordinary DRAM. In the figure, Vcc is an external power source voltage; Vss is the ground voltage; DQ is data to be inputted/outputted; and /OE is an output enable signal for controlling data input/output.

The internal reset circuit 3 is connected at the terminal a to the external power source and the internal boosted power source generating circuit 1. The rectifying circuit 4 is connected at the terminal a to the external power source and at the terminal b to the internal boosted power source generating circuit 1. The rectifying circuit 4 may be connected to the terminal c if need arises.

(1) First Embodiment

Figure 2:
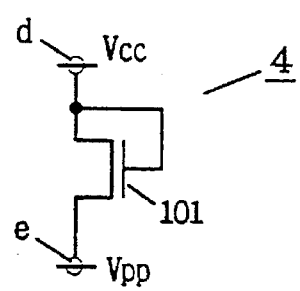
FIG. 2 is a circuit diagram of a first embodiment of a rectifying circuit 4 in an embodiment of a semiconductor according to the invention.

FIG. 2 is a first embodiment of the rectifying circuit in FIG. 1.

In FIG. 2, the rectifying circuit 4 comprises an NMOS transistor 101. The diode-connected NMOS transistor 101 has the terminal d from its source connected to the external power source at the terminal a in FIG. 1 and has the terminal e from its drain connected to the internal boosted power source generating circuit 1 at the terminal b in FIG. 1.

Figure 3:
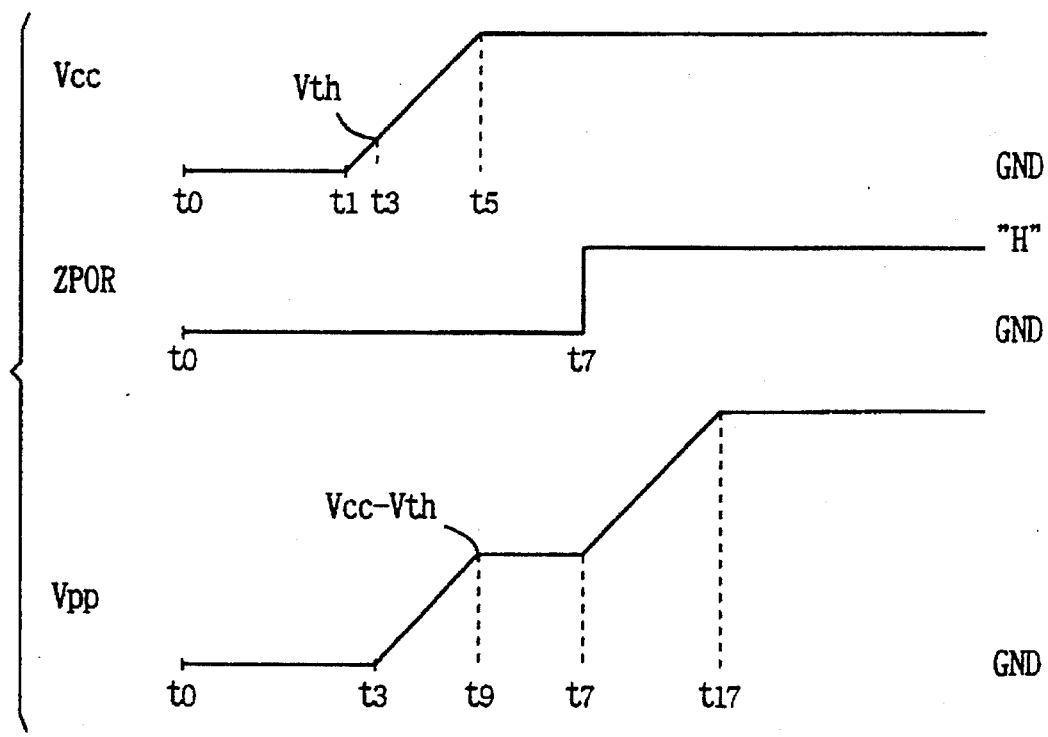
FIG. 3 is a timing chart showing how an internal boosted power source voltage Vpp is boosted in a first embodiment of the present invention.

The operation will now be described using the timing chart in FIG. 3.

When the external power source is off ($t_0 < t < t_1$), the external power source voltage Vcc, the internal boosted power source voltage Vpp, and the internal reset signal ZPOR delivered from the internal reset circuit 3 in FIG. 1 are all at the ground voltage GND. Turning on the external power source causes the external power source voltage Vcc to rise ($t_1$). When the external power source voltage Vcc exceeds the threshold voltage Vth of the NMOS transistor 101 ($t_3$), the NMOS transistor 101 is turned on, whereupon the internal boosted power source starts to be supplied with a voltage (Vcc−Vth). The internal boosted power source voltage Vpp starts to rise in such a manner as to follow the course of rise of the external power source voltage Vcc. The external power source voltage Vcc reaches the final value ($t_5$), supplying the internal power source with the voltage (Vcc–Vth). When the internal boosted power source voltage Vpp becomes (Vcc–Vth) ($t_9$), this voltage is retained until the internal reset signal ZPOR expires ($t_9 < t < t_7$). When the internal reset signal ZPOR expires ($t_7$), the internal boosted power source generating circuit 1 starts to operate, whereby the internal boosted power source voltage Vpp is raised to the intended boosted level at a stroke ($t_7 < t < t_{17}$).

As described above, if the internal boosted power source voltage Vpp is boosted half way before the internal boosted power source generating circuit 1 is started to operate, then the period of time in which the internal boosted power source generating circuit 1 which requires a large power consumption is saved; thus, the power consumption is reduced.

Figure 13:
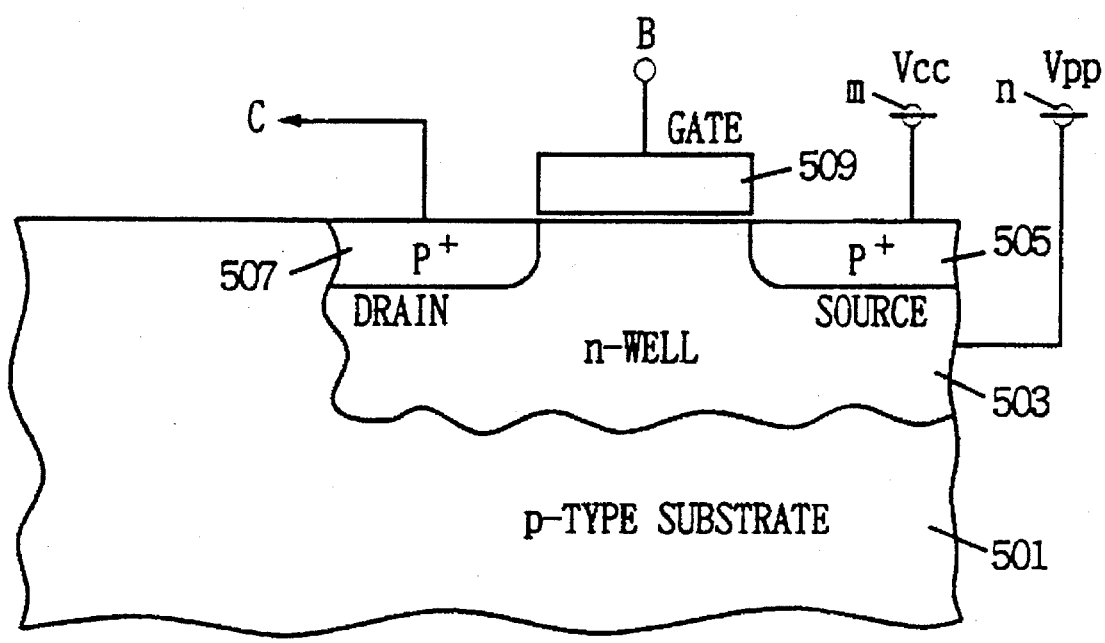
FIG. 13 is a view showing the internal construction of the PMOS transistor 403 shown in FIG. 11.

Further, in the arrangement shown in FIG. 13, since Vpp is boosted while following Vcc, latch-up will not occur.

In FIG. 2, even if the above arrangement is replaced by another arrangement in which a diode or other elements in diode connection is used in place of the NMOS transistor 101, the same operation is performed.

(2) Second Embodiment

Figure 4:
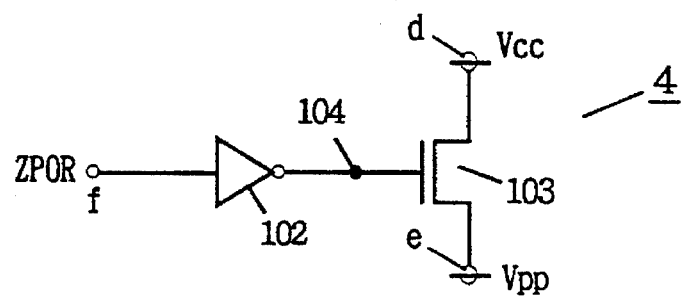
FIG. 4 is a circuit diagram of a second embodiment of a rectifying circuit 4 in a semiconductor storage device according to an embodiment of the invention.

FIG. 4 shows a second embodiment of the rectifying circuit 4 shown in FIG. 1.

In FIG. 4, the rectifying circuit 4 comprises an inverter 102, an NMOS transistor 103, and a node 104.

The inverter 102 is connected to the external power source and the terminal f is connected to the internal reset circuit 3 at the terminal c in FIG. 1 to receive the internal reset signal ZPOR, and the node 104 is connected to the gate of the NMOS transistor 103. The NMOS transistor 103 is connected at the terminal d leading to its source to the external power source at the terminal a in FIG. 1 and connected at the terminal e leading to its drain to the internal boosted power source generating circuit 1 at the terminal b in FIG. 1.

Figure 5:
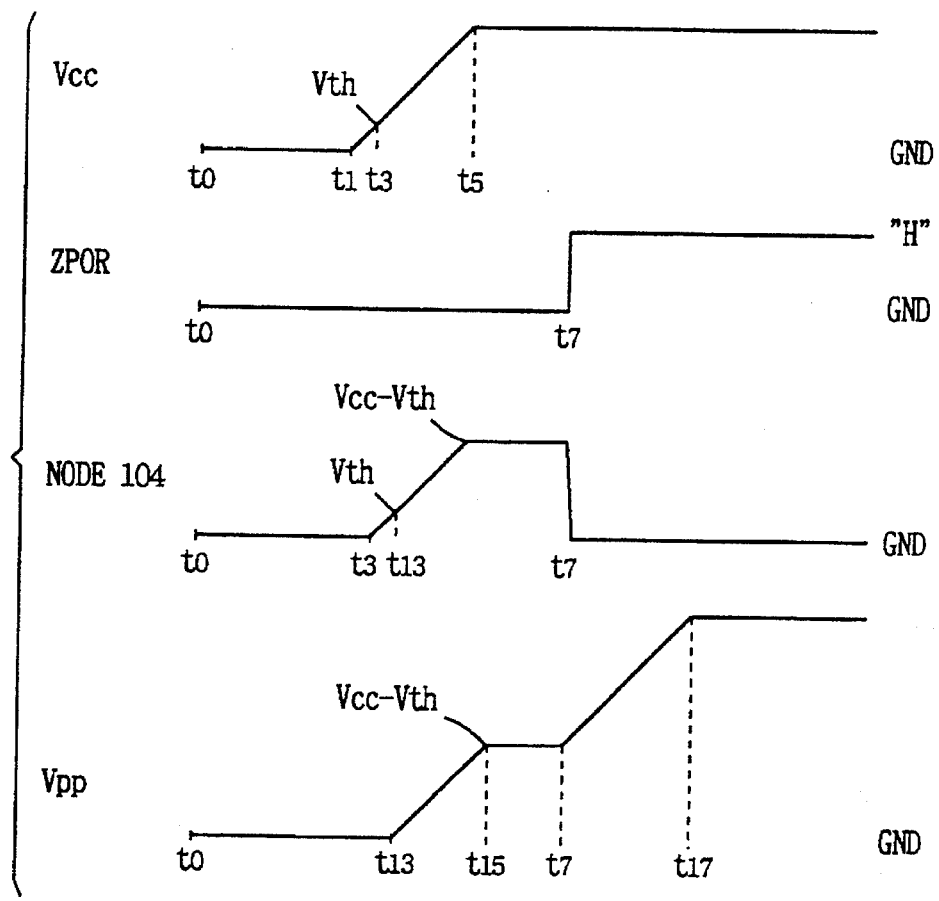
FIG. 5 is a timing chart showing how an internal boosted power source voltage Vpp is boosted in a second embodiment of the present invention.

The operation will now be described using the timing chart in FIG. 5.

When the external power source is off ($t_0 < t < t_1$), the external power source voltage Vcc, the internal boosted power source voltage Vpp, and the internal reset signal ZPOR are all at the ground voltage GND. Turning on the external power source causes the external power source voltage Vcc to rise ($t_1$). After the external power source has been turned on, a fixed period is the internal reset duration, so that the internal reset signal ZPOR remains at "L" level ($t_1 < t < t_7$). When the external power source voltage Vcc exceeds the threshold voltage Vth of the transistor in the inverter 102 ($t_3$), the potential at the node 104 starts to gradually rise. When the potential at the node 104 exceeds the threshold voltage Vth of the NMOS transistor 103 ($t_{13}$), the NMOS transistor 103 is turned on. When NMOS transistor 103 is turned on, the internal boosted power source is supplied with a voltage (Vcc–Vth). And the internal boosted power source voltage Vpp starts to rise. The power source voltage Vcc reaches the final value ($t_5$), and when the internal boosted power source voltage Vpp reaches the voltage (Vcc–Vth) ($t_{15}$), this voltage is retained until the internal reset signal ZPOR turns to "H" level ($t_{15} < t < t_7$). When the internal reset signal ZPOR turns to "H" level ($t_7$), the inverter 104 switches the node 104 to "L" level, lowering the gate voltage of the NMOS transistor 103 to turn off the NMOS transistor 103. When the internal reset signal ZPOR turns to "H" level, the internal boosted power source generating circuit 1 starts to operate, whereby the internal boosted power source voltage Vpp is raised to the intended boosted level at a stroke ($t_7 < t < t_{17}$). When the NMOS transistor 103 is turned off and the external power source and the internal boosted power source voltage Vpp are separated from each other, it is possible to prevent a leak current which flows from the internal boosted power source to the external power source even if the internal boosted power source voltage Vpp stepped up by the internal boosted power source generating circuit 1 shown in FIG. 1 becomes higher than the external power source voltage Vcc.

Further, as in the case of the first embodiment, the power consumption can be reduced by boosting the internal boosted power source voltage Vpp in advance before the internal boosted power source generating circuit 1 starts to operate.

(3) Third Embodiment

Figure 6:
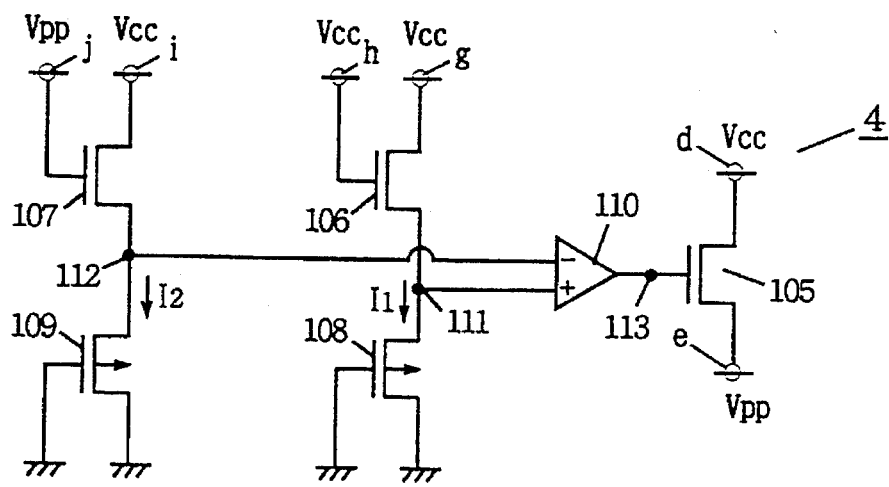
FIG. 6 is a circuit diagram of a third embodiment of a rectifying circuit 4 in a semiconductor storage device according to an embodiment of the invention.

FIG. 6 shows a third embodiment of the rectifying circuit 4 shown in FIG. 1.

In FIG. 6, the rectifying circuit 4 comprises NMOS transistors 105, 106 and 107, PMOS transistors 108 and 109, and a differential amplifier circuit 110.

The terminal d connected to the source of the NMOS transistor 105, the terminals g and h connected to the source and gate of the NMOS transistor 106, respectively, and the terminal i connected to the source of the NMOS transistor 107 are all connected to the external power source at the terminal a shown in FIG. 1. The terminal e connected to the drain of the NMOS transistor 105 and the terminal j connected to the gate of the NMOS transistor 107 are connected to the internal boosted power source generating circuit 1 at the terminal b shown in FIG. 1. The sources and gates of the PMOS transistors 108 and 109 are grounded. The drain of the NMOS transistor 106 and the drain of PMOS transistor 108 are connected at the node 111 to the non-inverting input terminal + of the differential amplifier circuit 110. The drain of the NMOS transistor 107 and the drain of PMOS transistor 109 are connected at the node 112 to the inverting input terminal – of the differential amplifier circuit 110. The output of the differential amplifier circuit 110 is connected at the node 113 to the gate of the NMOS transistor 105. The source-drain current I1 is the source-drain current of the NMOS transistor 106 and PMOS transistor 108, and the source-drain current I2 is the source-drain current of the NMOS transistor 107 and PMOS transistor 109. The NMOS transistors 106, 107 and the PMOS transistors 108, 109 are equal in size (W: gate width, L: gate length) to each other so that their characteristics are also the same.

Figure 7:
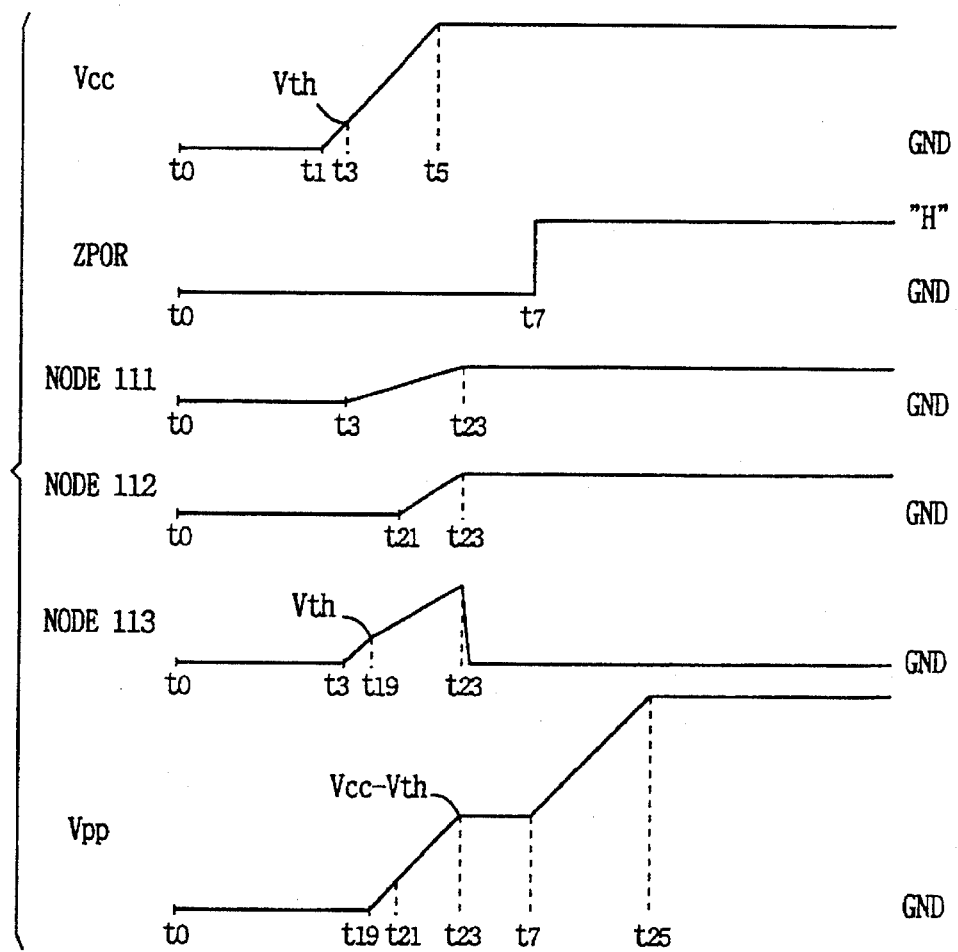
FIG. 7 is a timing chart showing how an internal boosted power source voltage Vpp is boosted in a third embodiment of the present invention.
Figure 8:
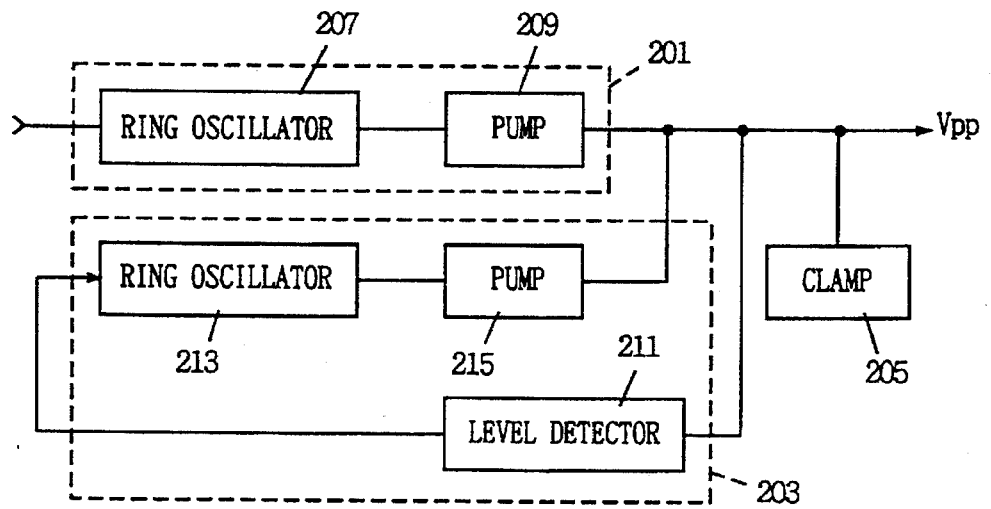
FIG. 8 is a block diagram showing an example of the arrangement of an internal boosted power source voltage generating circuit.
Figure 9:
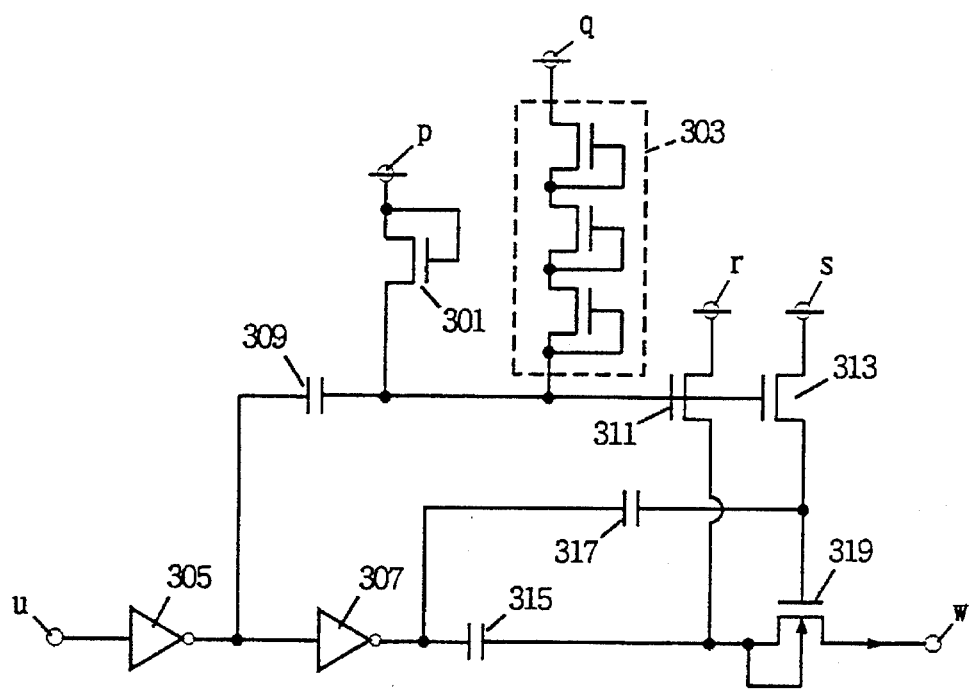
FIG. 9 is a circuit diagram of an example of a pump in the internal boosted power source voltage generating circuit.
Figure 10:
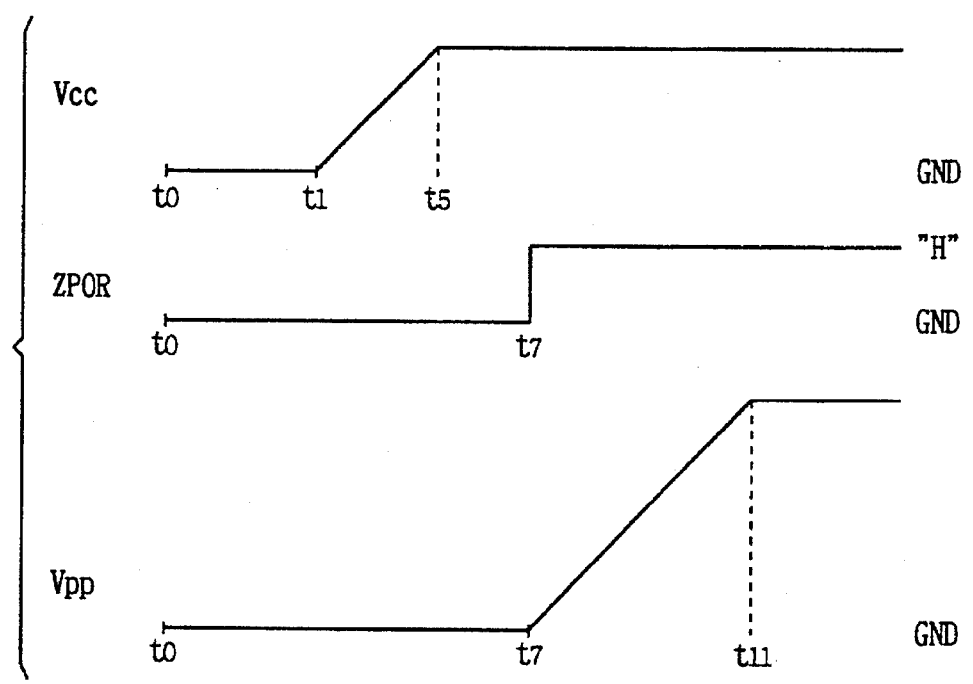
FIG. 10 is a timing chart showing how the internal boosted power source voltage Vpp in a conventional semiconductor storage device is boosted.
Figure 11:
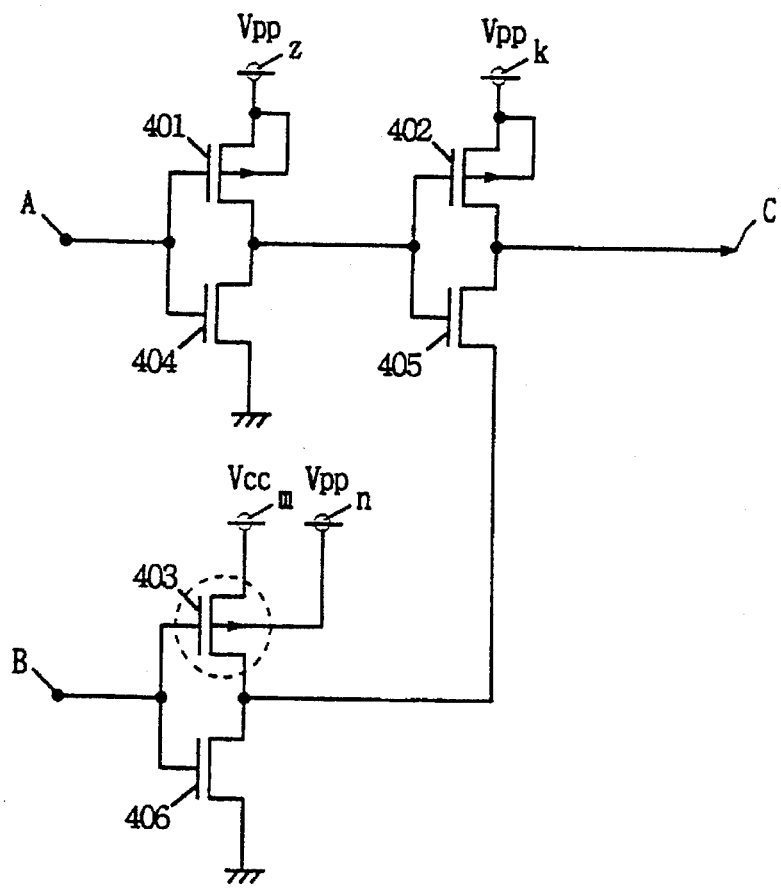
FIG. 11 is a circuit diagram of a circuit including a PMOS transistor 403 liable to cause latch-up.
Figure 12:
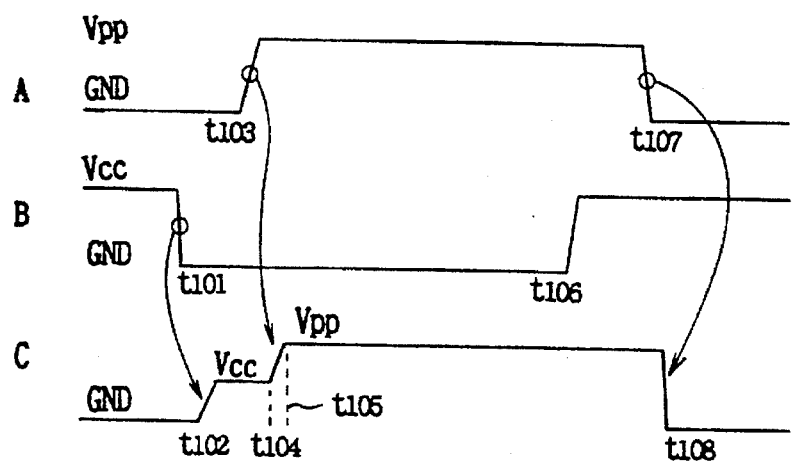
FIG. 12 is a timing chart showing the operation of the circuit shown in FIG. 11.

The operation will now be described using the timing chart in FIG. 7.

When the external power source is off ($t_0 < t < t_1$), the external power source voltage Vcc, the internal boosted power source voltage Vpp, and the internal reset signal ZPOR are all at the ground voltage GND. Turning on the external power source causes the external power source voltage Vcc to rise ($t_1$). After the external power source has been turned on, a fixed period ($t_1 < t < t_7$) is the internal reset duration, so that the internal reset signal ZPOR remains at "L" level and the internal boosted power source generating circuit 1 does not operate, with the internal boosted power source voltage Vpp remaining at the ground voltage GND ($t_1 < t < t_{19}$). Therefore, the NMOS transistor 106 is turned on, but the NMOS transistor 107 remains in the off state. The source-drain current I1 and the on-resistance of the PMOS transistor 108 elevate the voltage at the node 111 from the ground voltage GND ($t_3$). On the other hand, since the source-drain current I2 does not flow, the voltage at the node 112 remains at the ground voltage GND. When a potential difference appears between the nodes 111 and 112, the differential amplifier circuit 110 operates, causing the voltage at the node 113 to exceed the threshold voltage Vth ($t_{19}$), whereupon the NMOS transistor 105 is turned on, supplying the internal boosted power source with a voltage (Vcc−Vth). When the internal boosted power source voltage Vpp exceeds the threshold voltage Vth ($t_{21}$) of the NMOS transistor 107, the NMOS transistor 107 is turned on and the source-drain current I2 flows. During the time the voltage at the node 111 is higher than the voltage at the node 112 ($t_{21}<t<t_{23}$), the output (node 113) of the differential amplifier circuit 110 remains at "H" level. Therefore, when the external power source voltage Vcc reaches the final value ($t_5$), in the NMOS transistor 105 the voltage supplied to the internal boosted power source is (Vcc−Vth). During this time, the voltage at the node 112 gradually increases until it is equal to the voltage at the node 111, whereupon the output (at the node 111) of the differential amplifier circuit 110 turns to "L" level, turning off the NMOS transistor 105 so as to isolate the external power source and the internal boosted power source from each other. As a result of this isolation, the internal reset duration ends ($t_7$) and the internal boosted power source generating circuit 1 starts to operate, and even if the level of the internal boosted power source voltage Vpp becomes higher than the external power source voltage Vcc, it is possible to prevent a leak current from flowing from the internal boosted power source to the external power source; thus, the internal boosted power source voltage Vpp is elevated to the intended boosted level ($t_7<t<t_{25}$).

This third embodiment also, as in the case of the first embodiment, is capable of saving the power consumption by boosting the internal boosted power source voltage Vpp in advance before the internal boosted power source generating circuit 1 starts to operate.

While the threshold voltages of all transistors have been designated by Vth; however, there is no need for the values of Vth for all transistors to be the same.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor storage device for executing a program using a program voltage at a first level, comprising:
   means for receiving a power source voltage;
   means for detecting the course of rise of the level of said power source voltage;
   means for boosting said program voltage while following said course of rise of the level of said power source voltage and providing a program voltage at a second level, less than the first level; and
   program voltage generating means for boosting said program voltage at said second level to said program voltage at said first level, said program voltage generating means being actuated by a predetermined signal delivered a predetermined period of time after the rise of said power source voltage.

2. The semiconductor storage device as set forth in claim 1, wherein said semiconductor storage device includes means for retaining said program voltage at said second level.

3. A semiconductor storage device for executing a program using a first program voltage, comprising:
   means for receiving a power source voltage;
   program voltage generating means for generating said first program voltage after the lapse of a predetermined first time after reception of said power source voltage;
   rectifying means connected to said power source voltage and to said program voltage generating means for feeding a current only from said power source voltage to said program voltage generating means side accompanying the boost of said power source voltage,
   said rectifying means boosting the voltage of said program voltage generating means to a second program voltage which is lower than said first program voltage before the lapse of said first time; and
   means for stopping the operation of said rectifying means after the elapse of a predetermined time period.

4. The semiconductor storage device as set forth in claim 3, wherein said rectifying means comprises a MOSFET connected between said power source voltage and said program voltage generating means.

5. The semiconductor storage device as set forth in claim 4, wherein said MOSFET is an N-channel MOS transistor having a diode-connected gate electrode.

6. A semiconductor storage device for executing a program using a first program voltage, comprising:
   means for receiving a power source voltage;
   program voltage generating means for generating said first program voltage after the lapse of a predetermined first time after reception of said power source voltage; and
   rectifying means connected to said power source voltage and to said program voltage generating means for feeding a current only from said power source voltage to said program voltage generating means side accompanying the boost of said power source voltage,
   said rectifying means boosting the voltage of said program voltage generating means to a second program voltage which is lower than said first program voltage before the lapse of said first time, wherein the lapse of said first time is detected by a reset circuit providing a reset signal, and said rectifying means operates in response to said reset signal.

7. The semiconductor storage device as set forth in claim 6, wherein said rectifying means comprises a MOSFET connected between said power source voltage and said program voltage generating means, and a gate electrode of said MOSFET receives a signal which is reverse to said reset signal.

8. A semiconductor storage device for executing a program using a first program voltage, comprising:
   means for receiving a power source voltage;
   program voltage generating means for generating said first program voltage after the lapse of a predetermined first time after reception of said power source voltage; and
   rectifying means connected to said power source voltage and to said program voltage generating means for feeding a current only from said power source voltage to said program voltage generating means side accompanying the boost of said power source voltage,
   said rectifying means
   i) boosting the voltage of said program voltage generating means to a second program voltage which is lower than said first program voltage before the lapse of said first time, and
   ii) operating in response to a potential difference associated with said program voltage and said power source voltage; and
   complementary transistors connected in series between said power source voltage and the ground voltage through a first node, wherein one of the complementary transistors is adapted to operate according to the power source voltage, the other complementary transistor is adapted to operate according to said ground voltage, a voltage associated with said power source voltage is generated through said first node.

9. A semiconductor storage device for executing a program using a first program voltage, comprising:

means for receiving a power source voltage;

program voltage generating means for generating said first program voltage after the lapse of a predetermined first time after reception of said power source voltage; and rectifying means connected to said power source voltage and to said program voltage generating means for feeding a current only from said power source voltage to said program voltage generating means side accompanying the boost of said power source voltage, said rectifying means
i) boosting the voltage of said program voltage generating means to a second program voltage which is lower than said first program voltage before the lapse of said first time, and
ii) operating in response to a potential difference associated with said program voltage and said power source voltage; and complementary transistors connected in series between said power source voltage and the ground voltage through a second node, wherein
one of the complementary transistors is adapted to operate according to the program voltage,
the other complementary transistor is adapted to operate according to said ground voltage, a voltage associated with said program voltage is generated through said second node.

10. A semiconductor storage device for executing a program using a program voltage, comprising:

means connected to a power source input terminal for detecting the rise of the power source;

boost means for boosting said program voltage to a predetermined first level while receiving said power source;

means for actuating said boost means after the lapse of a predetermined time after said detection;

said boost means including means for preparatorily boosting said program voltage to a second level which is lower than said first level within said predetermined time; and means for stopping the operation of said preparatory boost means after the lapse of said predetermined time.

11. The semiconductor storage device as set forth in claim 10, wherein
said preparatory boost means comprises a rectifying means connected between said power source voltage input terminal and said boost means for boosting the voltage of said boost means according to said fed-in power source voltage.

12. The semiconductor storage device as set forth in claim 11, wherein said rectifying means comprises a MOSFET.

13. The semiconductor storage device as set forth in claim 12, wherein said MOSFET comprises an NMOSFET having a diode-connected gate.

14. A method for generating a program voltage for a semiconductor storage device for executing a program using a predetermined first voltage, comprising the steps of:

detecting a power source voltage;

boosting said program voltage to a second voltage lower than a first voltage according to the detected power source voltage; and boosting said program voltage to said first predetermined voltage subsequently to said boost to the second voltage, wherein
said predetermined first voltage is generated by a boost circuit,
said semiconductor storage device delivers a reset signal to start the operation of said boost circuit, and
said reset signal is delivered subsequently to the boost to said second voltage.

15. The method for generating a program voltage as set forth in claim 14, further including the step of stopping the boost of said program voltage to said second voltage after said reset signal has been delivered.

16. A semiconductor storage device for executing a program using a program voltage at a first level, comprising:

means for receiving a power source voltage including a power-on reset circuit for providing a power-on reset signal a predetermined period of time after the rise of said power source voltage;

means for detecting the course of rise of the level of said power source voltage;

means for boosting said program voltage while following said course of rise of the level of said power source voltage and providing a program voltage at a second level, less than the first level, prior to the power-on reset circuit providing the power-on reset signal; and program voltage generating means, responsive to the power-on reset signal from the power-on reset circuit, for boosting said program voltage at said second level to said program voltage at said first level.

* * * * *